US006171455B1

(12) United States Patent
Pavate et al.

(10) Patent No.: US 6,171,455 B1
(45) Date of Patent: Jan. 9, 2001

(54) TARGET FOR USE IN MAGNETRON SPUTTERING OF ALUMINUM FOR FORMING METALLIZATION FILMS HAVING LOW DEFECT DENSITIES AND METHODS FOR MANUFACTURING AND USING SUCH TARGET

(75) Inventors: Vikram Pavate; Keith J. Hansen, both of San Jose; Glen Mori, Pacifica; Murali Narasimhan; Seshadri Ramaswami, both of San Jose; Jaim Nulman, Palo Alto, all of CA (US)

(73) Assignee: Applied Materials Inc., Santa Clara, CA (US)

( * ) Notice: Under 35 U.S.C. 154(b), the term of this patent shall be extended for 0 days.

(21) Appl. No.: 09/419,712

(22) Filed: Oct. 14, 1999

Related U.S. Application Data (63) Continuation of application No. 08/979,192, filed on Nov. 26, 1997, now Pat. No. 6,001,227.

(51) Int. Cl.[7] .................................................. C23C 14/34

(52) U.S. Cl. .............................. 204/192.13; 204/192.15; 204/192.17; 204/298.03; 204/298.12; 204/298.13; 427/8; 118/712; 420/528

(58) Field of Search ................. 204/192.13, 192.15, 204/192.17, 298.03, 298.12, 298.13; 427/8; 118/712; 420/528

(56) References Cited

U.S. PATENT DOCUMENTS

| | | | |
|---|---|---|---|
| 5,268,236 | 12/1993 | Dumont et al. | 428/636 |
| 5,447,616 | 9/1995 | Satou et al. | 204/298.13 |
| 5,456,796 | 10/1995 | Gupta et al. | 156/643.1 |
| 5,456,815 | 10/1995 | Fukuyo et al. | 204/298.13 |
| 5,624,536 | 4/1997 | Wada et al. | 204/298.11 |
| 5,667,665 | * 9/1997 | Shindo et al. | 205/589 |
| 5,809,393 | 9/1998 | Dunlop et al. | 419/61 |
| 6,001,227 | * 12/1999 | Pavate et al. | 204/298.12 |

FOREIGN PATENT DOCUMENTS

| | | |
|---|---|---|
| 31 21 389A | 8/1982 | (DE) . |
| 196 09 439A | 9/1996 | (DE) . |
| 0 466 617 A1 | 1/1992 | (FR) . |
| 6-280005 | * 10/1994 | (JP) . |

OTHER PUBLICATIONS

Notification of Transmittal of The International Search Report from the International Searching Authority at the European Patent Office dated Mar. 16, 1999, 7 pages.

G.T. Murray, Preparation and Characterization of Pure Metals, Cubberley et al: "Metals Handbook, 9th Edition, vol. 2, Properties and Selection: Nonferrous Alloys and Pure Metals." Apr. 27, 1983, American Society for Metals, Oh, US XP002094554 86, pp. 709–713.

A.S. Pokrovskaya–Soboleva, A.L. Shapiro, T.S. Borisova, L.K. Mazurova, V.I. Razgulayeva, "Electric Strength of Vacuum Gap With Electrodes Made Of Carbographite Materials", Proceedings of the Sixth International Symposium on Discharges and Electrical Insulation in Vacuum, Swansea, UK, Jul. 1974, pp. 86–91.

(List continued on next page.)

Primary Examiner—Alan Diamond
(74) Attorney, Agent, or Firm—Fliesler, Dubb, Meyer & Lovejoy LLP (57) ABSTRACT

Improved targets for use in DC_magnetron sputtering of aluminum or like metals are disclosed for forming metallization films having low defect densities. Methods for manufacturing and using such targets are also disclosed. Conductivity anomalies such as those composed of metal oxide inclusions can induce arcing between the target surface and the plasma. The arcing can lead to production of excessive deposition material in the form of splats or blobs. Reducing the content of conductivity anomalies and strengthening the to-be-deposited material is seen to reduce production of such splats or blobs. Other splat limiting steps include smooth finishing of the target surface and low-stress ramp up of the plasma.

24 Claims, 5 Drawing Sheets

OTHER PUBLICATIONS

Patent Abstracts of Japan, 06280005, Oct. 1994.
Patent Abstracts of Japan, 03064447, Mar. 1991.
JP Abstract, JP 5214519, Aug. 1993.
Patent Abstracts of Japan, 06017246, Jan. 1994.

* cited by examiner

TARGET FOR USE IN MAGNETRON SPUTTERING OF ALUMINUM FOR FORMING METALLIZATION FILMS HAVING LOW DEFECT DENSITIES AND METHODS FOR MANUFACTURING AND USING SUCH TARGET

This application continues from Ser. No. 08/979,192, filed Nov. 26, 1997, now U.S. Pat. No. 6,001,237. The disclosure of said application is incorporated herein by reference.

BACKGROUND

1. Field of the Invention

The invention relates generally to physical vapor deposition (PVD) of metal films. The invention relates more specifically to DC magnetron sputtering of metals such as aluminum (Al) or aluminum alloys onto semiconductor substrates and the like for forming fine pitch metallization such as the electrically-conductive interconnect layers of modern integrated circuits.

2. Cross Reference to Related Patents

The following U.S. patent(s) is/are assigned to the assignee of the present application, and its/their disclosures is/are incorporated herein by reference:
(A) U.S. Pat. No. 5,242,566 issued Sep. 7, 1993 to N. Parker; and
(B) U.S. Pat. No. 5,320,728 issued Jun. 14, 1994 to A. Tepman.

3. Description of the Related Art

The electrically-conductive interconnect layers of modern integrated circuits (IC) are generally of very fine pitch (e.g., 10 microns or less) and high density (e.g., hundreds of lines per square millimeter).

A single, small defect in the precursor metal film that ultimately forms a metallic interconnect layer of an IC can be so positioned as to seriously damage the operational integrity of the IC. As such it is desirable to form metal films with no defects or as few, minimally sized defects as possible.

The metal films of integrated circuits are typically formed by physical vapor deposition (PVD). One low cost approach uses a DC magnetron apparatus such as the Endura™ system available from Applied Materials Inc. of California for sputtering aluminum (Al) or aluminum alloys onto semiconductor wafers.

Although such DC_magnetron PVD systems generally produce high quality metal films with relatively low defect densities, heretofore unexplained 'blobs' of extra material are occasionally observed in the deposited metal. These blobs can interfere with device formation and disadvantageously reduce mass production yield of operable devices.

The present inventors have isolated such blobs in DC_magnetron-formed aluminum films, have analyzed the composition and physical structures of such blobs, and have developed methods for minimizing the formation of such undesirable blobs.

SUMMARY OF THE INVENTION

The above-mentioned problems are overcome in accordance with the invention by providing an improved target for use in magnetron sputtering of aluminum, or of aluminum alloys or of like metals where the formed metal films having low defect densities.

It has been determined that the microscopic make up of the target in a DC_magnetron PVD system plays an integral role in the mechanisms that lead to blob formation.

More particularly, nonhomogeneous structures within the target such as dielectric inclusions (e.g., $Al_2O_3$ precipitates) and nonconductive voids (e.g., formed by trapped gas bubbles), when exposed as part of the target surface, are believed to create corresponding distortions in the electric fields that surround the target surface during the sputtering process. It is believed that large-enough distortions can evolve into points of field breakdown through which arcs of high current flow between the plasma and the target. Such arcing currents can result in localized melting of the target material and in the production of relatively large blobs of liquid material that splatter onto the wafer surface. The splattered material apparently draws back together on contact with the wafer surface, due to surface tension effects, and solidifies into the undesirable blob.

In accordance with a first aspect of the invention, targets are manufactured so as to minimize the sizes and numbers of dielectric inclusions (e.g., $Al_2O_3$ precipitates) and nonconductive voids (e.g., formed by trapped hydrogen bubbles).

Blob formation is additionally believed to be due to stress-induced breakdown of the target material when the sputtering plasma is struck. The electric fields and currents which develop near the surface of the target as the plasma is ignited tend to generate mechanical stresses within the target material. Localized breakdown due to poor mechanical strength of the target local material is believed to be another source of blob generation.

In accordance with a second aspect of the invention, targets are manufactured so as to homogeneously maximize the strength of the target material and thereby inhibit blob generation due to localized mechanical breakdown.

A target in accordance with the invention essentially excludes dielectric inclusions such as metal oxides ($Al_2O_3$), nitride precipitates, carbide precipitates, of sizes larger than about 1 micron in concentrations greater than 5,000 such inclusions per gram of target material. A target in accordance with the invention alternatively or further essentially excludes voids such as those caused by entrapped gas of sizes larger than about 1 micron in concentrations greater than 5,000 such voids per gram of target material. A target in accordance with the invention alternatively or further has an essentially homogeneous distribution of metal grain size in the range of about 75 micron and 90 micron. A target in accordance with the invention alternatively or further has an initial surface roughness of less than about 20 microinches.

A DC_magnetron PVD system in accordance with the invention comprises a target having one or more of the following characteristics: (a) essentially no dielectric inclusions such as metal oxides ($Al_2O_3$), nitride precipitates, carbide precipitates, of sizes larger than about 1 micron in concentrations greater than 5,000 such inclusions per gram of target material; (b) essentially no voids such as those caused by entrapped gas of sizes larger than about 1 micron in concentrations greater than 5,000 such voids per gram of target material; (c) an essentially homogeneous distribution of metal grain size in the range of about 75 micron and 90 micron; and (d) an initial surface roughness of less than about 20 microinches. A DC_magnetron PVD system in accordance with the invention further comprises means for ramping plasma power at a rate of 2 Kw per second or less.

A target manufacturing method in accordance with the invention comprises one or more of the following steps of: (a) obtaining purified aluminum having less than about 1 ppm of hydrogen and less than about 10 ppm oxygen; (b) casting the purified aluminum using a continuous-flow casting method wherein the melt skin is not exposed to an oxidizing atmosphere; (c) working the cast metal so as to produce an essentially homogeneous distribution of metal grains of diameters less than or equal to 100µ and second phase precipitates of diameters in the range of about 1 to 10µ and more than about 50% material having <200> texture; (d) smoothing the initial target surface to an average roughness of no more than about 20 microinches; (e) using ultrasonic cleaning to remove arc-inducing contaminants from the initial target surface; and (f) shipping the cleaned target in an inert gas pack.

A method for operating a DC_magnetron PVD system in accordance with the invention comprises the steps of: (a) installing a new target having one or more of the following characteristics: (a) essentially no dielectric inclusions such as metal oxides ($Al_2O_3$), nitride precipitates, carbide precipitates, of sizes larger than about 1 micron in concentrations greater than 5,000 such inclusions per gram of target material; (b) essentially no voids such as those caused by entrapped gas of sizes larger than about 1 micron in concentrations greater than 5,000 such voids per gram of target material; (c) an essentially homogeneous distribution of metal grain size in the range of about 75 micron and 90 micron; and (d) an initial surface roughness of less than about 20 microinches. A DC_magnetron PVD operating method in accordance with the invention further comprises ramping plasma power at a rate of no more than 2 Kw per second or less.

Other aspects of the invention will become apparent from the below detailed description.

BRIEF DESCRIPTION OF THE DRAWINGS

The below detailed description makes reference to the accompanying drawings, in which.

DETAILED DESCRIPTION

Figure 1:
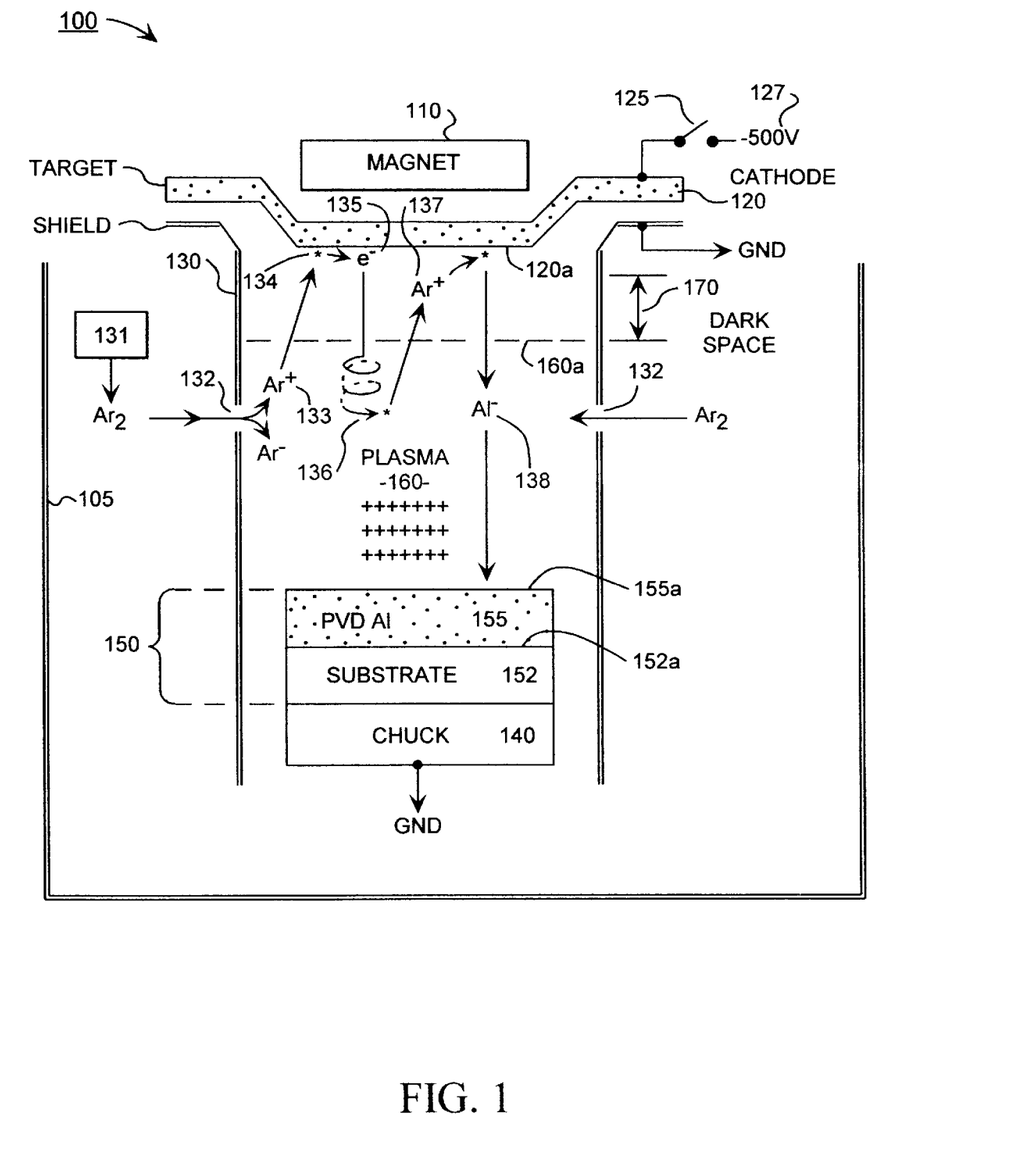
FIG. 1 is a schematic diagram of a DC sputtering magnetron.

FIG. 1 shows a schematic diagram of a DC sputtering magnetron system 100. A magnet 110 is positioned over a portion of target 120. The target includes a deposition-producing portion that is electrically conductive and is composed of the to-be-sputtered material (e.g., a metal such as aluminum). Target 120 is typically of a symmetrical form such as a circular disk, but may have various bends or other features such as shown for adaptively fitting into a specific DC_magnetron PVD system and for producing specific distributions of electrical field intensity and gas flow in accordance with design specifics of the receiving DC_magnetron PVD system. The target 120 is typically structured for removable insertion into the corresponding DC_magnetron PVD system 100. Targets are periodically replaced with a new targets given that the PVD process erodes away the to-be-deposited material of each target.

A switching means 125 may be provided for selectively connecting the target 120 to a relatively negative voltage source 127. In general, the negative voltage source 127 provides a DC cathode voltage in the range of about −470V to −530V relative to the potential on an opposed anode (ground or GND in the illustrated example). The specific cathode voltage varies according to design. When switching means 125 is closed to connect the target 120 with negative voltage source 127, the target can act as a source of negatively charged particles such as 135 ($e^-$) and 138 ($Al^-$) which are discussed below. Because of this the target is also referred to as the cathode.

A tubular gas-containment shield 130, usually of cylindrical shape, is provided below and spaced apart from the target 120. Shield 130 is electrically conductive and is generally coupled to ground (GND) or to another relatively positive reference voltage so as to define an electrical field between the target 120 and the shield. Shield 130 has a plurality of apertures 132 defined through it for admitting a supplied flow of gas 131 such as argon (Ar) from the exterior of the shield 130 into its interior.

A workpiece-supporting chuck 140 is further provided centrally below and spaced apart from the target 120, usually within the interior of the shield 130. Chuck 140 is electrically conductive and is generally also coupled to ground (GND) or to another relatively positive reference voltage so as to define a further electrical field between the target 120 and the chuck.

A replaceable workpiece 150 such as a semiconductor wafer is supported on the chuck centrally below the target 120. Workpiece 150 originally consists of a substrate 152 having an exposed top surface 152a. As PVD sputtering proceeds, a metal film 155 having a top surface 155a builds up on the substrate 152. It is desirable that the build up or deposition of the metal film 155 be uniform across the entire top surface 152a of the substrate, but as explained herein, anomalies sometimes interfere with homogeneous deposition.

Workpiece substrate 152 may include an insulative layer composed for example of $SiO_2$. In such cases, the metal film 155 may be electrically insulated from chuck 140 and the voltage of the metal film 155 will float to a slightly negative level relative to the chuck's voltage (e.g., GND).

DC_magnetron operation initiates as follows. When switching means 125 is closed, initial electric fields are produced between the target 120 and the shield 130 and the chuck 140. Plasma igniting gas is introduced. The illustrated assembly of FIG. 1 is usually housed in a low pressure chamber 105 (partially shown) that maintains an internal pressure in the range of about 2 to 5 Torr or lower. Some of the supplied gas 131 that enters the interior of shield 130 disassociates into positively charged ions ($Ar^+$) and negatively charged ions ($Ar^-$) when subjected to the initial electric fields. One so-generated positive ion is shown at 133. Due to electrostatic attraction, ion 133 ($Ar^+$) accelerates towards and collides with the bottom surface of the target at first collision point, say 134. The point of collision is denoted with an asterisk ("*"). This initial collision induces emission of an electron ($e^-$) 135 from cathode 120. (A particle of target material (Al) may also be dislodged by collision 134.) The emitted electron 135 drifts down towards the more positive chuck 140. However, the magnetic fields of magnet 110 give electron 135 a spiraling trajectory as indicated at 136. Eventually electron 135 collides with a molecule of the inflowing gas 131 (e.g., $Ar_2$). This second collision (*) produces another positively charged ion 137 ($Ar^+$) which accelerates towards and collides with the bottom surface of the target. This third collision produces yet another electron like 135, and a chain reaction is established leading to the creation of a sustained plasma 160 within the interior of the gas-containment shield 130. Plasma 160 is charged positive relative to the cathode 120 and begins to act like a floating anode. This changes the electric field distribution within the DC_magnetron PVD system 100. At some point the electric field distribution stabilizes into a long term steady state.

The ballistic collisions of massive particles such as 137 ($Ar^+$) with the bottom surface of the target 120 sometimes cause small particles of the target's material to break off and move toward the underlying workpiece 150. An example of such an emitted target particle is shown at 138. The sizes and directions of the emitted target particles tend to produce a relatively uniform deposition of the emitted material (e.g., aluminum) on the top surface (152*a* and later 155*a*) of the workpiece 150.

On occasion, however, as explained above, the deposition is not uniform in that blobs or 'splats' appear on or within the deposited metal film 155. Some of the splats can have diameters as large as 500 microns, which is quite large in a world where operational features of the affected device have dimensions of 1 micron or less. Such splats are undesirable.

Figure 2:
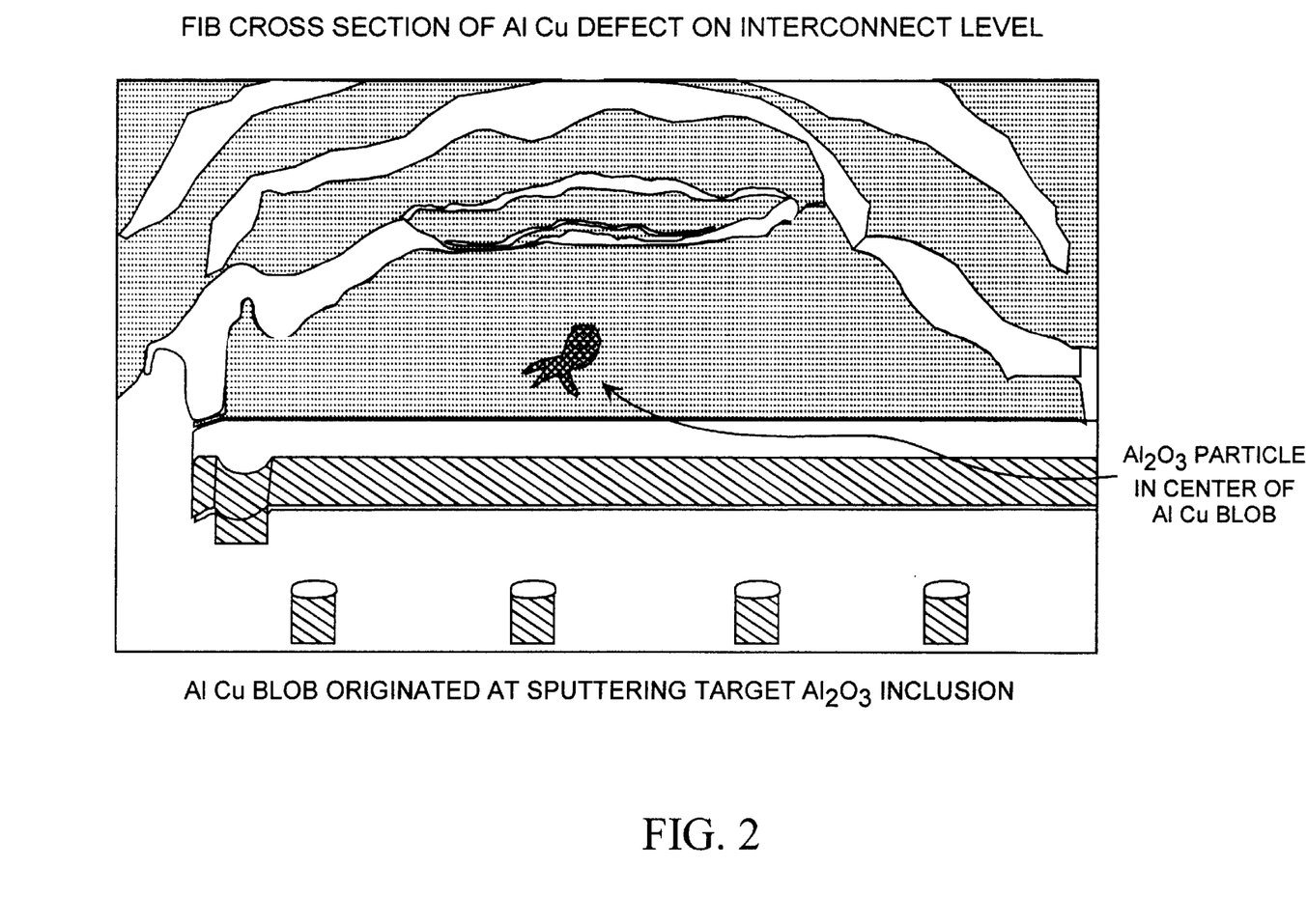
FIG. 2 is a micrograph showing a cross sectional side view of an isolated 'splat' or 'blob' within the interconnect structure of an integrated circuit.

FIG. 2 is a micrograph taken with a focused ion beam (FIB) microscope at a magnification sufficient to show an anomalous section of a 1 micron-thick aluminum line. The micrograph shows a cross sectional side view of an isolated 'splat' or 'blob' within the interconnect structure of an integrated circuit. The splat diameter is approximately 5 microns and the splat height is roughly 1.5 microns. In this particular case, the deposited metal film (155) is an alloy of aluminum and copper (AlCu). The 'splat' is given its name because of the appearance that something had splattered onto the otherwise planar, PVD deposited metal film.

In the captured splat of FIG. 2, an inclusion having a diameter of roughly 0.3 micron is seen within the body of the splat. Inclusions are not routinely observed in every splat. Inclusions such as the one shown in FIG. 2 were isolated and analyzed chemically. The analysis showed that such inclusions were composed primarily of the oxide, $Al_2O_3$.

The present inventors deduced that the $Al_2O_3$ inclusion had come from the specific target (120) used in the PVD sputtering process, given that the feed gas consisted of relatively pure Ar, and the substrate had been cleaned, and there was nothing else in the DC_magnetron PVD system that could act as a source of $Al_2O_3$.

The present inventors further deduced that the $Al_2O_3$ inclusion was a causal factor in the generation of the observed splat even though the splat is further defined by an excessive amount of AlCu that appears to have splattered onto the forming metal film during the PVD process.

Further questions remained, however. What was the specific mechanism that made the $Al_2O_3$ inclusion a causal factor in the generation of the observed splat? Why do many splats not include such $Al_2O_3$ inclusions?

It is believed that the correct answer lies in understanding how electrical fields are distributed within the DC_magnetron system 100 (FIG. 1) after plasma 160 reaches steady state stability, and how this stability can be temporarily disturbed.

Referring to FIG. 1, as the plasma 160 reaches steady state stability, there develops between the bottom surface 120*a* of the target and a top boundary 160*a* of the plasma, an area that is essentially free of electrons or other charged particles. This charge-free region is referred to in the literature as the 'dark space' or the 'dead space'. Its extent is referenced in FIG. 1 as 170 (not to scale).

A relatively large voltage differential develops between the top 120*a* and bottom 160*a* of the dark space 170. Target-emitted electrons such as 135 are believed to tunnel rather than to drift through the dark space 170 and to thereby maintain the relatively large voltage differential between the top and bottom of the dark space 170.

A relatively homogenous distribution of electric field intensity is generally needed along planes 160*a* and 120*a* to maintain the continuity of the dark space 170. (Lower plane 160*a* is referred to as a virtual anode surface.)

It is believed that pinhole-like breaches in the continuity of the dark space 170 occur from time to time. A breach may occur because of a localized increase in electric field intensity. The latter causal effect may come about because a discontinuity develops in the localized conductivity of one or both of the cathode surface 120*a* or virtual anode surface 160*a*. If the size of the breach is significant, a sudden rush of charged particles may pass through the breaching pinhole, from the plasma 160 into the target 120. In essence, an arc of current of relatively large magnitude, can pass between the plasma 160 and the target 120 at the point of breach of the dark space 170.

If a sufficiently large arc is produced, a significant amount of heat may be generated at or around the arc-struck point of the target's surface 120*a*. Localized temperature may rise sufficiently to melt an area about the arc-struck point. The molten target material can separate from the target and become drawn to the more positively charged chuck 140. When the molten target material hits the top surface 155*a* of the workpiece, it splatters, cools, and adheres to the top surface 155*a* as an anomaly.

Computer simulations have shown that dropping a glob of molten metal onto a planar, solid metal surface produces a dome-shaped blob of material having ripples of the type seen in the 'splat' of FIG. 2 on the planar surface. Re-consolidation of the splattered material occurs due to surface tension and cooling of the splattered blob. The blob of anomalous material re-consolidates and solidifies into the rippled, dome-shaped form. This supports the present inventors' hypothesis that some splats are produced by a melting of material on the target's surface 120*a*.

The present inventors suspect that localized melting is not the only mechanism by which nonhomogeneous deposition of excessive target material occurs onto the workpiece surface 155*a*. An arc-struck part of the target's surface 120*a* might be mechanically weak. The shock or resultant thermal stress of a current arc may dislodge the mechanically weak part from the target's surface. The dislodged but not necessarily molten material can then be drawn to the workpiece top surface 155*a* to form a nonhomogeneous, excessive deposition at the point of landing.

$Al_2O_3$ inclusions are electrically nonconductive or of high electrical resistance, and as such they define discontinuities in the voltage distributing or conductive properties of the target's bottom surface 120*a*. Internal $Al_2O_3$ inclusions within the target become part of the target's surface as the surface 120*a* is eroded away by ion bombardment to expose the previously internal inclusions.

Abrupt changes in the localized intensity of electric fields neighboring the bottom surface 120*a* of the target can develop when sufficiently large $Al_2O_3$ inclusions, or other forms of disruption in the electrical conductivity properties of the target's bottom surface 120a become exposed. This can lead to breach of the dark space 170, arcing, and the production of molten blobs or mechanically-dislodged anomalies. In general, such regions of disruption in the electrical conductivity properties of the target's bottom surface 120a are referred to herein as conductivity anomalies. A conductivity anomaly of relatively high electrical resistance is defined as a region having a resistivity at least 100 times greater than a corresponding electrical resistivity of an anomaly-free representative portion of the to-be-deposited metal.

In view of the above, and in accordance with one aspect of the invention, it is desirable to minimize the numbers and sizes of conductivity anomalies within the to-be-deposited material of the target 120. Aside from oxides such as $Al_2O_3$, conductivity anomalies can include nitride precipitates, carbide precipitates, contaminants that produce cathodic vapor bursts, and voids in the metal, where the latter voids may be originally defined by trapped gas bubbles.

It is to be understood that when the composition or other characteristics of the 'target' is discussed herein, that discussion is primarily directed to portions of the target that are bombarded by plasma-produced ions and are possibly subjected to being struck by arcs and as a result producing anomalous depositions. Targets in general may have additional portions that are adapted for replaceable receipt into and/or electrical coupling with the remainder of the DC_magnetron PVD system. Those additional portions may not require special compositioning or structuring in accordance with the present invention in instances where those additional portions are not bombarded by plasma-produced ions.

In accordance with another aspect of the invention, it is desirable to maximize the microhardness (and thereby the micro-strength) of the target material so that arc-struck parts of the target are prevented from being so mechanically weak as to allow arc-induced dislodging of such target parts.

Disruptions in the uniformity of electric field intensity about the bottom surface 120a of the target can also come about due to excessive roughness in the initial form of that bottom surface 120a.

In accordance with yet another aspect of the invention, it is desirable to minimize the roughness of the initial bottom surface 120a of the target so as to inhibit disruptions in the uniformity of electric field intensity about the dark space 170.

Disruptions in the uniformity of electric field intensity about the bottom surface 120a of the target can also come about due to excessive dirt being left on the initial form of that bottom surface 120a when the target is first used (burnt in). The dirt can induce arcing. The latter can produce pits or other unevenness in the target surface which then produces yet more arcing.

In accordance with yet a further aspect of the invention, it is desirable to minimize dirt on the initial bottom surface 120a of the target so as to inhibit dirt-induced arcing.

An aluminum target in accordance with the invention has one or preferably more of the following homogenous characteristics of Table 1:

TABLE 1

| PROPERTY | PREFERRED RANGE |
| --- | --- |
| Dielectric Inclusion Content, where such inclusions have widths of 0.3 micron or more | less than about 5000 inclusions per gram of target material |
| Hydrogen content | less than about 0.5 ppm |
| Carbon content | less than about 10 ppm |
| Oxygen content | less than about 10 ppm |
| Nitrogen content | less than about 10 ppm |
| Metal grain size | less than about 100 micron |
| (200) textured material | greater than 50% |
| (111) textured material | less than about 3% |
| Hardness | greater than about 50 (Rockwell scale) |
| Surface roughness | less than about 20 micro-inches |
| Alloy strengthening addend | greater than about 0.5% Cu by weight |
| Alloy precipitate size | about 5 microns or less |
| Other impurities | less than about 10 ppm |

Looser requirements can also be adapted for Table 1. For example: the number of allowed inclusions per gram of target material can be widened to 7,500 or 10,000; the definition of to-be-limited inclusions can be broadened to those having widths of about 1 micron or more; and the allowed hydrogen content can be loosened to less than about 1 ppm (parts per million).

Another, more stringently-controlled, aluminum target in accordance with the invention has one or preferably more of the following characteristics of Table 2:

TABLE 2

| PROPERTY | PREFERRED RANGE |
| --- | --- |
| Dielectric Inclusion Content, where such inclusions have widths of 0.1 micron or more | less than about 5000 inclusions per gram of target material |
| Hydrogen content | less than about 0.075 ppm |
| Carbon content | less than about 5 ppm |
| Oxygen content | less than about 10 ppm |
| Nitrogen content | less than about 7 ppm |
| Metal grain size | between about 75 micron and 90 micron |
| (200) textured material | greater than 75% |
| (111) textured material | less than about 1% |
| Hardness | greater than about 50 (Rockwell scale) |
| Surface roughness | less than about 16 micro-inches |
| Alloy strengthening addend | about 0.5% Cu by weight |
| Alloy precipitate size | less than about 4 microns |
| Other impurities | less than about 5 ppm |

Even tighter requirements can also be adapted for Table 2. For example: the number of allowed inclusions per gram of target material can be narrowed to 3,000 or 1,000; the definition of to-be-limited inclusions can be tightened to include those having have widths of about 0.5 micron or more; the allowed hydrogen content can be tightened to less than about 0.05 ppm (parts per million), the allowed initial surface roughness can be reduced to 10 microinches or less; and the required amount of <200> texture material can be raised to 90% or more.

Figure 3:
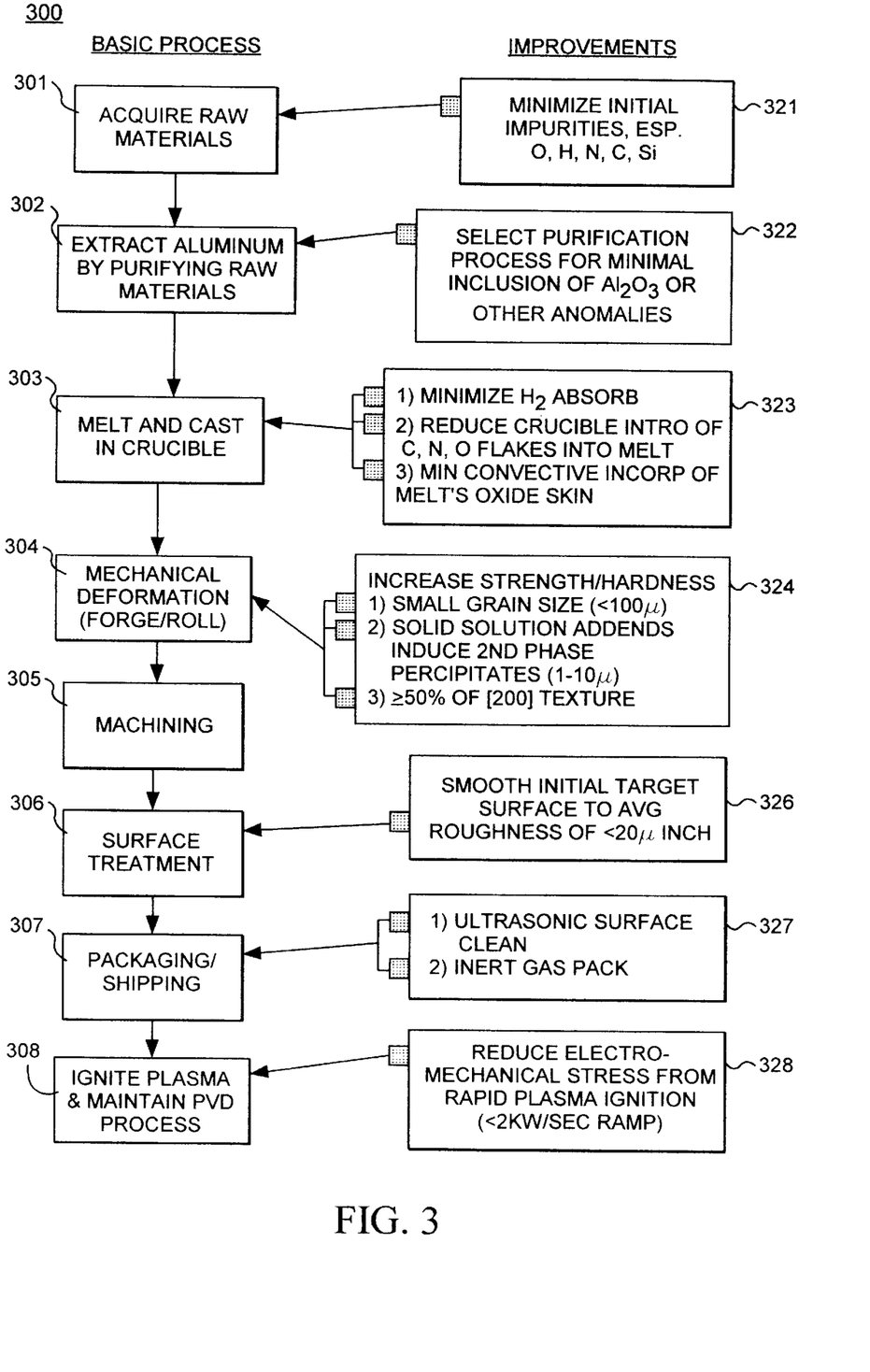
FIG. 3 is a flow chart showing steps taken in the manufacture and subsequent use of a target, including improvement steps in accordance with the invention.

Referring to FIG. 3, the manufacturing steps by which targets in accordance with the invention can be realized are discussed.

FIG. 3 is a flow chart showing steps taken in the manufacture and subsequent use of a target in accordance with the invention. The overall manufacture-and-use process is referenced as 300.

At step 301, the raw materials that will form the target are acquired through mining or other means. It is desirable to acquire the raw materials from appropriate sources so that the acquired raw materials have minimal amounts of initial impurities, particularly oxygen (O), hydrogen (H), nitrogen (N), carbon (C), and silicon (Si) in the recited order.

Minimizing initial O content is especially desirable because such oxygen content can lead to later formation of undesirable metal oxides such as $Al_2O_3$ inclusions. Minimizing N and C content is less but still desirable because the inclusion of significant amounts of these elements can lead to later formation of undesirable insulative inclusions composed of metal nitrides and/or metal carbides. Silicon can combine with any of O, N and C to form dielectric inclusions, and as such its content should also be minimized. Hydrogen can form hydrogen bubbles that become trapped within the alloy melt during casting (see step 303 described below).

Improvement step 321 (minimizing initial impurities) can be carried out by selecting a mine or other source of raw materials that meets the criteria discussed above or by using a supplier further on the vertical production chain that uses products of raw materials obtained in this way.

At step 302, the acquired raw materials are purified to produce an initial form of the target metal. The target metal can be aluminum or an alloy thereof such as $Al_xCu_ySi_z$ where x+y+z=100% and x>>y+z.

Some purification methods tend to generate more insulative or high resistance anomalies than others. Improvement step 322 is to select a purification method that minimizes generation of insulative or high resistance anomalies. The Hall-Bayert aluminum purification method is one example of such an inclusions minimizing process. The supplier of the purified target metal should be selected according to whether they use, or instructed to use, a purification method that minimizes generation of insulative or high resistance inclusions.

Examples of purified metals that conform with the above include, but are not limited to high quality, aluminum available from Pechineg Inc.; and from Sumimoto Inc. of Japan.

At step 303, the purified materials are melted and cast, typically in a casting crucible.

Figure 4A:
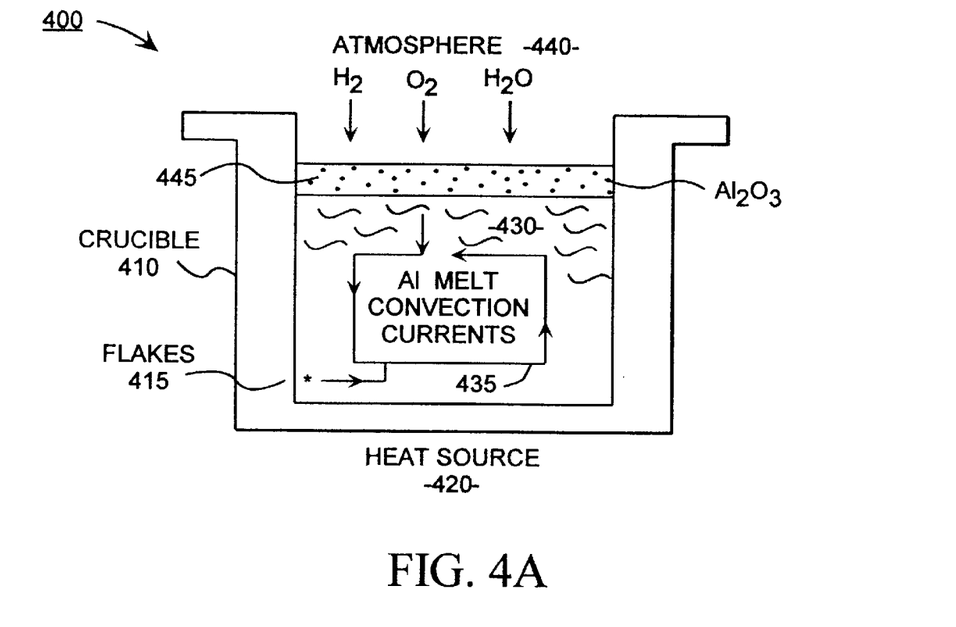
FIGS. 4A and 4B respectively show cross sectional views of a simple casting process and the resultant product for purpose of explanation.

Referring to FIG. 4A, the casting process can introduce large amounts of insulative or high resistance inclusions or voids if an appropriate casting method is not selected. FIG. 4A shows a cross sectional view of a simple, no-flow casting process 400 that, in accordance with the invention, should be avoided. Undesirable casting method 400 is shown for purpose of explaining why other processes are more desirable in accordance with the invention.

In FIG. 4A, a crucible 410 is provided coupled to a heat source 420. Crucible 410 is typically made of a ceramic such as graphite. Solid input material (e.g., purified aluminum) is placed inside the crucible. Heat is applied from the heat source 420 to produce a liquid melt 430 of the input material. The top surface of the melt 430 is exposed to an atmosphere 440 containing one or more of hydrogen ($H_2$), oxygen ($O_2$), water vapor ($H_2O$) and other gases (e.g., $N_2$, $CO_2$) or other vapors.

Because of the high temperatures involved, the top surface of the melt 430 reacts with the atmosphere 440 to produce an oxide skin 445 at the interface between the melt 430 and the atmosphere 440. The oxide skin 445 is relatively thin compared to the volume of the melt 430. As such, one would not expect to find great incorporation of the oxide material into the melt 430. However, convective flow currents 435 may be established within the melt. These currents 435 may work to suck in already-produced oxides from the skin 445 toward the center of the melt and to expose fresh melt material to the oxidizing atmosphere 440. As such significant quantities of oxides (significant for our purposes) can be incorporated into the melt 430 during this simple, one-shot, no-flow, casting method 400.

Also, due to wear and tear over time, additional material 415 such as graphite particles can flake off from the interior walls of the crucible for incorporation within the melt 430. These flakes 415 can produce carbides or other insulative inclusions within the melt.

Also, because liquified metals such liquid aluminum tend to absorb hydrogen ($H_2$) rather easily when hot, such gases can be absorbed from the atmosphere 440 and dissolved into the melt 430 in significant quantities. The same gases (e.g., hydrogen) may not be as soluble in the metal as the metal later cools. When large vats of molten metal are cooled, the earlier absorbed gases (e.g., hydrogen) can become trapped in the form of gas precipitates or bubbles. These are later seen as voids in the solid mass of the cast metal.

Figure 4B:
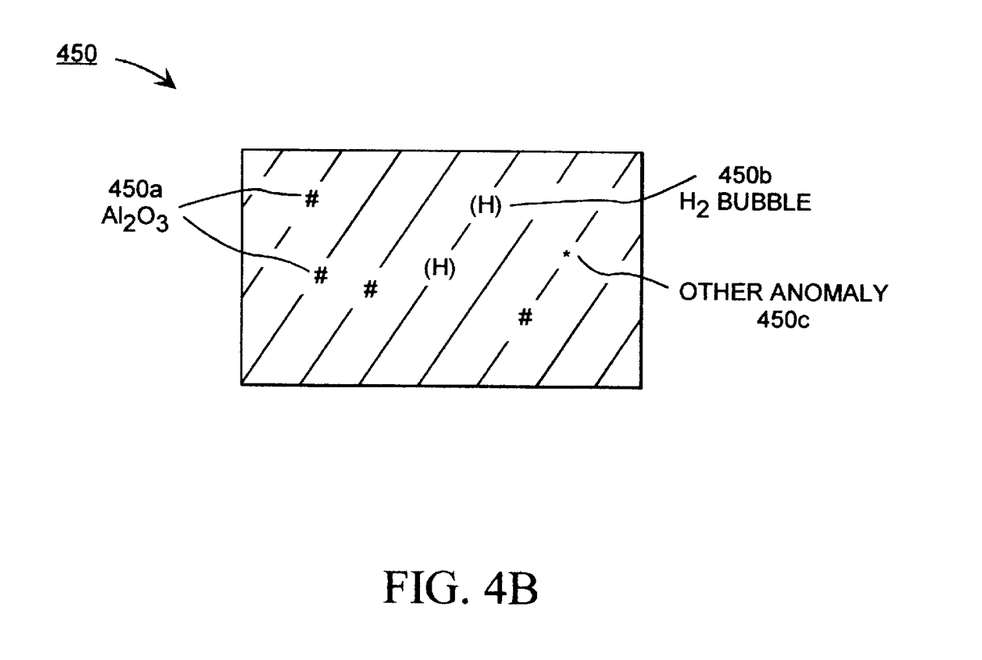

Referring to FIG. 4B, it is seen that after pouring and cooling, the cast metal 450 (e.g., cast Al) can contain large amounts of oxide inclusions 450a, trapped hydrogen bubbles 450b and other anomalies 450c (e.g., crucible flakes) that were introduced during the illustrated casting process 400. If and when such anomalies 450a, 450b, 450c become part of the bottom surface 120a of the target (FIG. 1), they can induce arcing between the plasma 160 and the target 120, and the latter can result in the generation of undesirable blobs or splats within the PVD deposited metal 155.

In accordance with the invention, alternative casting methods should be used to minimize convective incorporation of gases, oxides and crucible flakes into the melt. In general these alternate methods rely on continuous flow casting rather than on noncontinuous casting wherein a melt is allowed to develop convective currents. In general these alternate methods further rely on in-vacuum or plunger-covered processes rather than those that expose the melt to an atmosphere 440 containing inclusion-producing moieties such as oxygen and hydrogen.

Included in these alternate, casting methods are the continuous flow methods used by Johnson Matther Corp. of Spokane, Wash., the continuous flow methods used by Tosoh Corp. of Columbus, Ohio, and the in-vacuum flow casting methods used by Japan Energy Corp. of Tsukuba, Japan. The cast metal produced by these alternate methods tend to exhibits low amounts of inclusion content in accordance with the invention.

Improvement step 323 of FIG. 3 indicates that one or more of the following methods should be used in the casting step 303: (1) minimize absorption of $H_2$ and/or other gases from atmosphere by using in-vacuum or plunger-covered methods; (2) reduce crucible introduction of flakes into the melt by periodically scrapping loose material off the casting container walls or using other techniques for preventing flaking; (3) use continuous-flow rather than in-place casting methods so as to prevent convective incorporation into the melt of oxidized skin material 445.

Continuing with FIG. 3, after the casting process, the metal is typically worked by forging, rolling, deforming, or other metal working techniques as indicated at step 304. The metal working step 304 can alter any one or more of the texture, hardness, alloy precipitate distributions, and other such attributes of the worked-on metal.

In accordance with improvement step 324 of the invention, the post-work metal texture should be at least 50% of the <200> texture and less than 3% of the [111] texture. As is known in the art, <200> texture enhances uniformity of PVD deposition.

In further accordance with improvement step 324 of the invention, the post-work metal texture should also have a homogeneously-distributed microhardness of substantially more than 20 Rockwell, preferably a homogeneously-distributed microhardness of at least 40 Rockwell. Hardness correlates with strength. The homogeneously-distributed microhardness of a target in accordance with the invention provides greater localized strength and thus greater immunity to melting or other dislodging of target material due to arcing.

In further accordance with improvement step 324 of the invention, the post-work metal texture should also have a homogeneously-distributed content of second-phase hardening alloy precipitates such as of the $Al_xCu_ySi_z$ formulation, where x+y+z=100% and x>>y+z, and further where the second-phase hardening alloy precipitates primarily have widths in the range of 1 micron to 10 microns. $Al_4Cu_9$ is an example of such second-phase hardening alloy precipitates.

Of course, for such work-induced generation of second-phase hardening alloy precipitates, the melt material should already include the appropriate alloy constituents such as copper or silicon. For PVD deposition of interconnect metal used in integrated circuits, the selection of alloy constituents should also conform to the limitations of the metal etch processes used after PVD. In general, for currently used metal etching processes, the copper content should be equal to less than about 0.5% by weight and the silicon equal to less than about 1% by weight.

In further accordance with improvement step 324 of the invention, the post-work metal should also have a homogeneously-distributed content of small metal grains primarily having widths less than about 100 microns.

Machining step 305 is carried out conventionally to define the shape of the target.

For the following surface treatment step 306, the improvement is to smooth the target's initial surface to a roughness that is no more than, and preferably less than 20 micro inches. Polishing to a greater smoothness helps to reduce the number of sharp surface features that might act as field emission points and helps to keep the electric field intensity smooth. Arcing may begin at the tips of field emission points that emit electrons.

Surface polishing is followed by cleaning and shipping step 307. The improvement step 327 includes the use of ultrasonic cleaning for removing dielectric contaminants from the polished surface. It is believed that dielectric surface contaminants can define initial arcing spots. Initial arcing can occur when the target is first installed into the sputtering chamber and burned in. Such initial arcing can result in long-term damage to the target's otherwise smooth surface. The resultant roughness can produce further arcing and undesired splats after burn-in completes.

After the ultrasonic cleaning, the target should be packaged in a hydrophobic, non-outgassing package containing an inert gas such as argon (Ar). These clean conditions should be continued as the target is installed into the sputtering chamber. The reason for such clean-room style handling of the target is to again prevent contamination of the target's initial surface with arc-inducing substances.

Step 308 refers both to the initial burn-in of the target and its subsequent long-term use. During burn-in, the plasma is used to remove any remaining contaminants from the target surface while dummy wafers pass through the sputter chamber. Some recipes call for rapid burn-in wherein the full operational power level (e.g., 10 Kw) is immediately applied to the target. It is believed that such rapid burn-in can disadvantageously stress the target mechanically and produce weak spots and consequential splat generation. In accordance with improvement 328, electromechanical stresses to the target which result from rapid plasma ignition are avoided as much as possible. Target burn-in should be taken in slow increments such as first applying only one Kw or less to the target for an initial burn-in, then applying 3 Kw for a second burn-in period, then 5 KW and finally, the production level power which in this example is 10.6 Kw. During burn-in, sample wafers are run through the sputtering chamber and the reflectants of the sputtered-on aluminum films is measured. The optical reflectants of the aluminum film improves as the burn-in process removes surface contaminants from the target. Burn-in is deemed to be complete when the reflectants value stabilizes at about 200% of the reflectants value of the corresponding silicon.

The same improvement 328 is further applied during production sputtering each time the plasma is ignited. Rather than having rapid ignition of the plasma from no power to the full production level power (e.g., 10.6 Kw), it is preferable to slowly ramp up the ignition power at, say, 2 Kw per second, and more preferably at 0.5 Kw/sec to 1.0 Kw/sec or less while chamber pressure is modulated. Power ramp down can be at a more accelerated rate of say 3 Kw per second or less and chamber pressure should be kept low during this time to exhaust loose particles. The slow power ramp ups and ramp downs tend to reduce the amount of electromechanical stress applied to the target over unit time. This is believed to reduce the number of weak spots produced in the target as a result of mechanical stressing. Additionally, slow ramp downs tend to reduce end-of-process re-adhesion of material to the target. Re-adhered material can increase surface roughness or create splat-generating points in other ways. In accordance with the invention therefore, plasma powering means 125 (FIG. 1) includes means for ramping power up to the plasma at a rate of 2 Kw per second or less and ramping down power to the plasma at a rate of 3 Kw per second or less.

Figure 5:
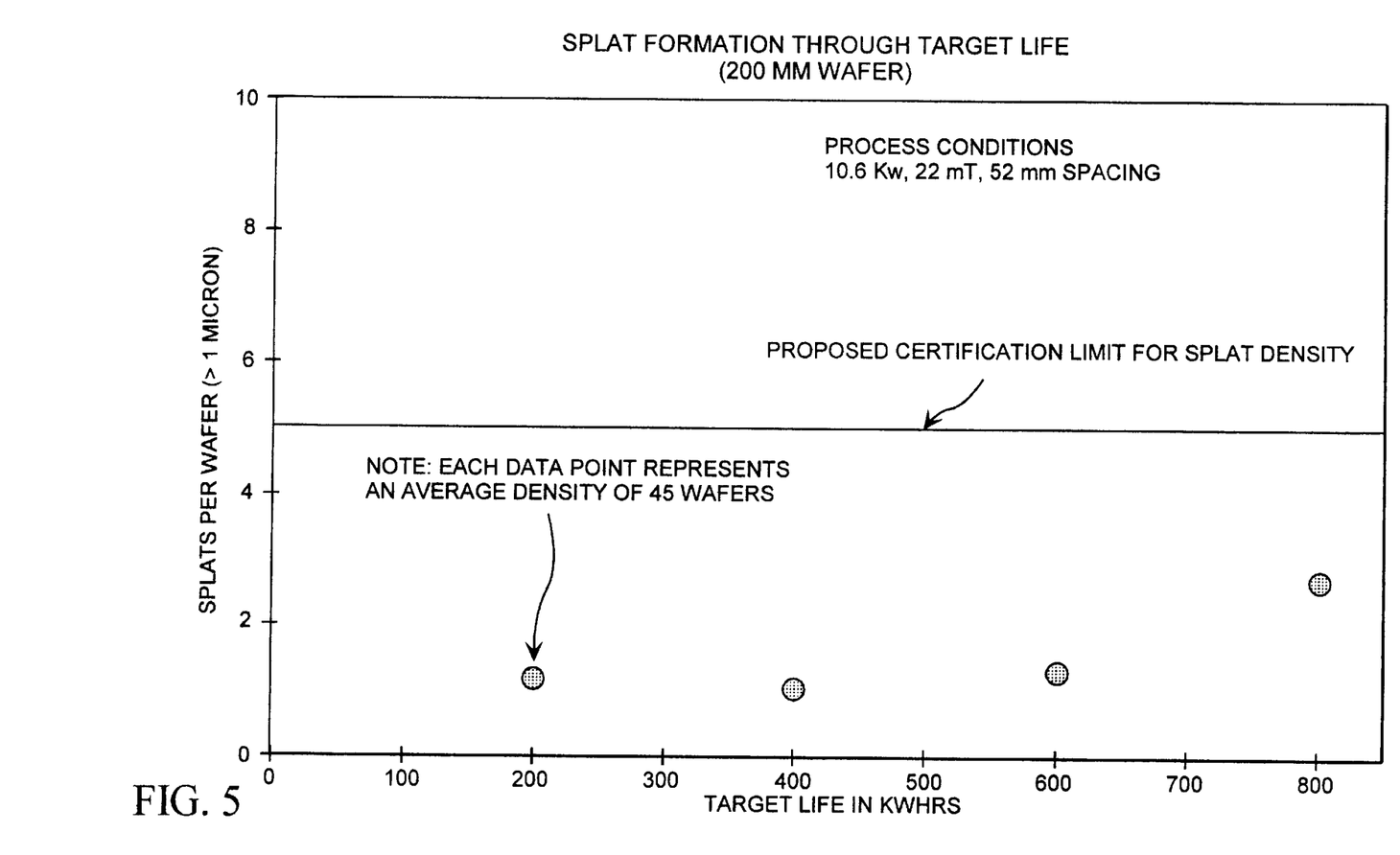
FIG. 5 is a plot showing average splats number per wafer over sampled groupings of 45 wafers each taken every 200 Kw hours of a sample target in accordance with the invention.

FIG. 5 is a plot showing splat generation density over the life of a target produced in accordance with the invention. This particular target had the following characteristics: there were essentially no dielectric inclusions such as metal oxides ($Al_2O_3$), nitride precipitates, carbide precipitates, of sizes larger than about 1 micron in concentrations greater than 5,000 such inclusions per gram of target material; there were essentially no voids such as those caused by entrapped gas of sizes larger than about 1 micron in concentrations greater than 5,000 such voids per gram of target material; an essentially homogeneous distribution of metal grain size in the range of about 75 micron and 90 micron was provided; an initial surface roughness of less than about 20 microinches was provided.

The average number of splats per wafer (where a splat is defined as an abnormality greater than 1 micron in diameter) was measured over lots of 45 wafers each with samples being taken every 200 Kw hours of usage of the target. Each wafer was 200 mm in diameter. The peak power level during sputtering was 10.6 Kw produced at 2 mTorr pressure with a target-to-wafer spacing of 52 mm. The goal was to produce less than five splats per wafer on average. As seen in FIG. 5, the average splat density remained at less than two splats per wafer for the first 600 KwHrs of target life and climbed to approximately three splats per wafer average after approximately 800 KwHrs of target life.

In contrast to FIG. 5, conventional production targets which were not formulated in accordance with the tight process controls of the present invention tended to produce 10 or more splats per wafer on average. The test results of FIG. 5 show that tight control of target manufacture significantly reduces the average number of splats per wafer.

Testing of targets for conformance with the above criteria may be carried out as follows. Inclusion content of the target may be measured using a wet chemical dissolution technique. In one such method polyethylene beakers are thoroughly cleaned before use. Acids and reagent water are filtered through 0.45 micron diameter, membrane filters before use. Sample aluminum targets are rough cut by saw to sample sizes such as 1 gram each, then finished to 240 grit on polishing wheels. The samples are then precleaned by dipping in a separate bath of 30% HCl for a short time (e.g., 5 seconds) just before full dissolution, in order to remove any traces from the grinding. The samples are thereafter dissolved to their full extent in a clean aqueous solution having 30% HCl at room-temperature or higher. 100 mL is used in the case of 1 gram samples, and 500 mL is used for 10–30 gram samples. Solids are collected out of the HCl solution on 0.45 micron gridded diameter filters for optical microscopy/SEM analysis, and on 0.22 micron ungridded 47 mm diameter filters for chemical analysis. Copper is dissolved off using a 10% $HNO_3$ wash on the filters. All these operations should be carried out in a HEPA filtered laminar flow hood. The washed filters are then allowed to dry in a class 100 clean room, before microscopic examination. The inclusion size distribution may be determined using manual light microscopy techniques such as, ASTM F24 and F25. Oblique lighting should be used to prevent contamination during the analysis.

Gas/void content and size distribution in aluminum target samples may be measured using LECO analysis (Liquid Emission Collemetry). Metal hardness, grain size, and other working-induced characteristics may be determined using conventional metal characterization techniques. Targets from appropriately sampled lots that meet the criteria set forth above may then be designated as conforming in accordance with accepted statistical techniques. Targets from appropriately sampled lots that do not meet one or more of the criteria set forth above should be excluded from PVD metal operations where splat formation is a concern.

The above disclosure is to be taken as illustrative of the invention, not as limiting its scope or spirit. Numerous modifications and variations will become apparent to those skilled in the art after studying the above disclosure.

By way of example, the production of conforming targets and conforming use thereof may include purchase from a third party source of targets that have already passed through any one or more of say, steps 301–305 (plus corresponding improvements 321–324) followed by the carrying out of the remaining steps, such as say 306–308 (plus corresponding improvements 326–328). Sampling may be used to check statistical conformance by third party suppliers to the specifications called for by the respective improvement steps.

Given the above disclosure of general concepts and specific embodiments, the scope of protection sought is to be defined by the claims appended hereto.

What is claimed is:

1. A qualifying method for qualifying samples from lots of similarly manufactured targets adapted for use in a DC-magnetron PVD system, said method comprising the steps of testing the samples for satisfaction of at least following characteristics (a.1) and (a.2):
   (a.1) less than about 10,000 dielectric inclusions per gram of target material wherein the dielectric inclusions have widths of 0.3 micron or more; and
   (a.2) a hydrogen content of less than about 0.5 ppm.

2. The qualifying method of claim 1 wherein said testing of the samples further includes testing for satisfaction of at least a following (a.3) characteristic:
   (a.3) an essentially homogeneous distribution of metal grains each of a diameter less than about 100 microns.

3. The qualifying method of claim 2 wherein said testing of the samples further includes testing for satisfaction of at least a following (a.4) characteristic:
   (a.4) at least 50% material having {200} texturing.

4. The qualifying method of claim 3 wherein said testing of the samples further includes testing for satisfaction of at least a following (a.5) characteristic:
   (a.5) an initial surface roughness on a deposition-producing portion of less than 20 microinches.

5. The qualifying method of claim 1 wherein said testing of the samples further includes testing for satisfaction of at least a following (a.3) characteristic:
   (a.3) at least 50% material having {200} texturing.

6. The qualifying method of claim 1 wherein said testing of the samples further includes testing for satisfaction of at least a following (a.3) characteristic:
   (a.3) an initial surface roughness on a deposition-producing portion of less than 20 microinches.

7. A qualifying method for qualifying targets that are adapted for use in a DC magnetron PVD system, the targets each having a deposition-producing portion consisting of a to-be-deposited metal, said qualifying method comprising steps of testing the targets for density of conductivity anomalies to assure that said target is characterized at least by
   a homogeneous content of less than about 10,000 conductivity anomalies per gram of the to-be-deposited metal where each said conductivity anomaly in said content of less than about 10,000 conductivity anomalies per gram is a region having a microscopically-measurable diameter or width of at least 1 micron and where each said conductivity anomaly defines an insulative or high resistivity region, high resistivity being at least 100 times greater than a corresponding electrical resistivity of an anomaly-free representative of the to-be-deposited metal;
said steps of testing comprising:
   (a) determining the density of insulative or high resistivity inclusions in said to-be-deposited metal; and
   (b) determining the density of voids in said to-be-deposited metal.

8. The qualifying method of claim 7 wherein said step of determining the density of inclusions comprises:
   (a.1) exposing a sample of the to-be-deposited metal to a first solution that dissolves into solution at least some non-inclusion parts of the to-be-deposited metal but does not dissolve into solution said insulative or high resistivity inclusions; and
   (a.2) after exposing the sample to the first solution, collecting from solution and on a filter having pores of a diameter less than 1 micron, insulative or high resistivity inclusions from the exposed sample that had not dissolved into solution.

9. The qualifying method of claim 8 wherein said step of determining the density of inclusions further comprises:

(a.3) microscopically inspecting the inclusions collected on said filter to thereby determine the density of said inclusions.

10. The qualifying method of claim 9 wherein said inspection step (a.3) is preceded by the step of:

(a.4) exposing the filter to a second solution that dissolves away other non-inclusion parts of the to-be-deposited metal but does not dissolve away said insulative or high resistivity inclusions.

11. The qualifying method of claim 8 wherein said filter is characterized by pores of a diameter that is no more than 0.45 micron.

12. The qualifying method of claim 8 wherein said step of determining the density of voids comprises:

(b.1) using Liquid Emission Collemetry analysis on a sample of the to-be-deposited metal.

13. A qualifying method for qualifying targets that are adapted for use in a DC magnetron PVD system, the targets each having a deposition-producing portion consisting of a to-be-deposited metal, said qualifying method comprising steps of receiving assurances from manufacturers of the targets with respect to manufacturing steps that affect density of conductivity anomalies to assure that said targets are characterized at least by a homogeneous content of less than about 10,000 conductivity anomalies per gram of the to-be-deposited metal where each said conductivity anomaly in said content of less than about 10,000 conductivity anomalies per gram is a region having a microscopically-measurable diameter or width of at least 1 micron and where each said conductivity anomaly defines an insulative or high resistivity region, high resistivity being at least 100 times greater than a corresponding electrical resistivity of an anomaly-free representative portion of the to-be-deposited metal;

said received assurances including at least that the to-be-deposited metal is characterized by:

(a) a hydrogen content of less than about 0.5 ppm; and (b) an oxygen content of less than about 10 ppm.

14. The qualifying method of claim 13 wherein said received assurances further include at least that the to-be-deposited metal is characterized by:

(c) a nitrogen content of less than about 10 ppm; and (d) a carbon content of less than about 10 ppm.

15. The qualifying method of claim 13 wherein said received assurances further include at least that the to-be-deposited metal is characterized by:

(c) an essentially homogeneous distribution of metal grains each of a diameter less than about 100 microns.

16. The qualifying method of claim 13 wherein said received assurances further include at least that the to-be-deposited metal is characterized by:

(c) at least 50% material having {200} texturing.

17. The qualifying method of claim 13 wherein said received assurances further include at least that the to-be-deposited metal is characterized by:

(c) an essentially homogeneous distribution of second phase precipitates of diameters in the range of about 1 micron to 10 microns.

18. The qualifying method of claim 13 wherein said received assurances further include at least that the to-be-deposited metal is characterized by:

(c) an initial surface roughness on a deposition-producing portion thereof of less than 20 microinches.

19. The qualifying method of claim 13 wherein said received assurances are sufficient to assure that said target is characterized by:

a homogenous content of less than about 5,000 conductivity anomalies per gram of the to-be-deposited metal.

20. The qualifying method of claim 19 wherein said received assurances are sufficient to assure that:

countable conductivity anomalies in said content of less than about 5000 conductivity anomalies per gram are regions having a microscopically-measurable diameter or width of at least 0.3 micron.

21. The qualifying method of claim 19 wherein said received assurances are sufficient to assure that:

countable conductivity anomalies in said content of less than about 5000 conductivity anomalies per gram are regions having a microscopically-measurable diameter or width of at least 0.1 micron.

22. The qualifying method of claim 13 wherein said to-be-deposited metal includes aluminum as a major component thereof.

23. The qualifying method of claim 13 wherein said received assurances further include at least that the to-be-deposited metal is characterized by:

(c) a {111} textured material content of less than about 3%.

24. The qualifying method of claim 13 wherein said received assurances further include at least that the to-be-deposited metal is characterized by:

a dielectric inclusion content of less than about 5000 inclusions per gram of the to-be-deposited metal where each said dielectric inclusion in said inclusion content is a dielectric material region having a detectable size of at least 0.3 micron.

* * * * *